United States Patent
Ganguly et al.

(10) Patent No.: US 12,362,225 B2
(45) Date of Patent: Jul. 15, 2025

(54) METHOD FOR FABRICATING GERMANIUM/SILICON ON INSULATOR IN RADIO FREQUENCY SPUTTER SYSTEM

(71) Applicant: Indian Institute of Technology Bombay, Mumbai (IN)

(72) Inventors: Udayan Ganguly, Mumbai (IN); Apurba Laha, Mumbai (IN); Suddhasatta Mahapatra, Mumbai (IN); Amita, Mumbai (IN); Krista Roluahpuia Khiangte, Mumbai (IN)

(73) Assignee: INDIAN INSTITUTE OF TECHNOLOGY BOMBAY, Maharashtra (IN)

( * ) Notice: Subject to any disclaimer, the term of this patent is extended or adjusted under 35 U.S.C. 154(b) by 0 days.

(21) Appl. No.: 17/253,462

(22) PCT Filed: Jun. 21, 2019

(86) PCT No.: PCT/IN2019/050469
§ 371 (c)(1),
(2) Date: Dec. 17, 2020

(87) PCT Pub. No.: WO2019/244174
PCT Pub. Date: Dec. 26, 2019

(65) Prior Publication Data
US 2021/0249300 A1    Aug. 12, 2021

(30) Foreign Application Priority Data
Jun. 22, 2018  (IN) .............................. 201821023394

(51) Int. Cl.
*H01L 21/762*   (2006.01)
*H01L 21/02*    (2006.01)

(52) U.S. Cl.
CPC ................. *H01L 21/76248* (2013.01); *H01L 21/02192* (2013.01); *H01L 21/02266* (2013.01)

(58) Field of Classification Search
CPC ......... H01L 21/76248; H01L 21/02192; H01L 21/02266; H01L 21/76294; H01L 21/7624;
(Continued)

(56) References Cited

U.S. PATENT DOCUMENTS 7,674,751 B2 * 3/2010 Malozemoff ........... H01P 11/00
                                                     505/231
8,796,121 B1 * 8/2014 Dargis .............. H01L 21/02381
                                                     438/496
(Continued)

OTHER PUBLICATIONS

Cattaruzza et al., "Er-doped alumina crystalline films deposited by radiofrequency magnetron co-sputtering," Optical Materials, vol. 33, Issue 7, May 2011, pp. 1135-1138 (Year: 2011).*
(Continued)

*Primary Examiner* — Julia Slutsker

(57) ABSTRACT

Embodiments herein disclose a method providing deposition of Gadolinium Oxide ($Gd_2O_3$) on a semiconductor substrate. The method comprises of selecting, in an RF-sputter system, a predefined substrate and depositing, in an Ar-plasma struck, the $Gd_2O_3$, over the predefined substrate to obtain a layer of the $Gd_2O_3$ over the predefined substrate. The $Gd_2O_3$ is grown epitaxially over the predefined substrate. The method further provides performing, annealing, of the layer of the $Gd_2O_3$ over the predefined substrate at a predefined temperature for a predefined time and obtaining, a layer of the $Gd_2O_3$, over the predefined substrate. Embodiment also provides a method for fabricating Semiconductor on Insulator Substrate (SIS).

6 Claims, 11 Drawing Sheets

(58) Field of Classification Search
CPC ......... H01L 21/02381; H01L 21/02433; H01L 21/02565; H01L 21/0263
See application file for complete search history.

(56) References Cited

U.S. PATENT DOCUMENTS

| | | | |
|---|---|---|---|
| 11,217,743 B2* | 1/2022 | Natali | H01L 21/02573 |
| 2002/0198112 A1* | 12/2002 | Paranthaman | C23C 14/024 |
| | | | 505/236 |
| 2008/0096374 A1* | 4/2008 | Shamiryan | H01L 21/28088 |
| | | | 257/E21.309 |
| 2008/0286949 A1* | 11/2008 | Atanackovic | C30B 29/16 |
| | | | 438/763 |
| 2009/0236595 A1* | 9/2009 | Atanackovic | H01L 21/8254 |
| | | | 257/E29.296 |

OTHER PUBLICATIONS

Pampillon et al., "Optimization of in situ plasma oxidation of metallic gadolinium thin films deposited by high pressure sputtering on silicon," J. Vac. Sci. Technol. B 31(1), Jan./Feb. 2013 (Year: 2013).*

* cited by examiner

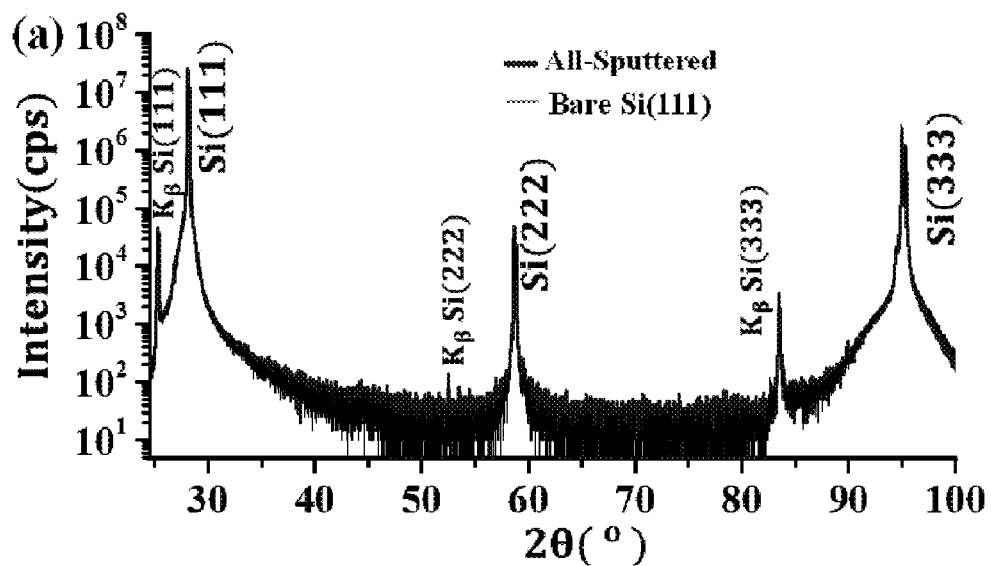
FIG. 8(a)
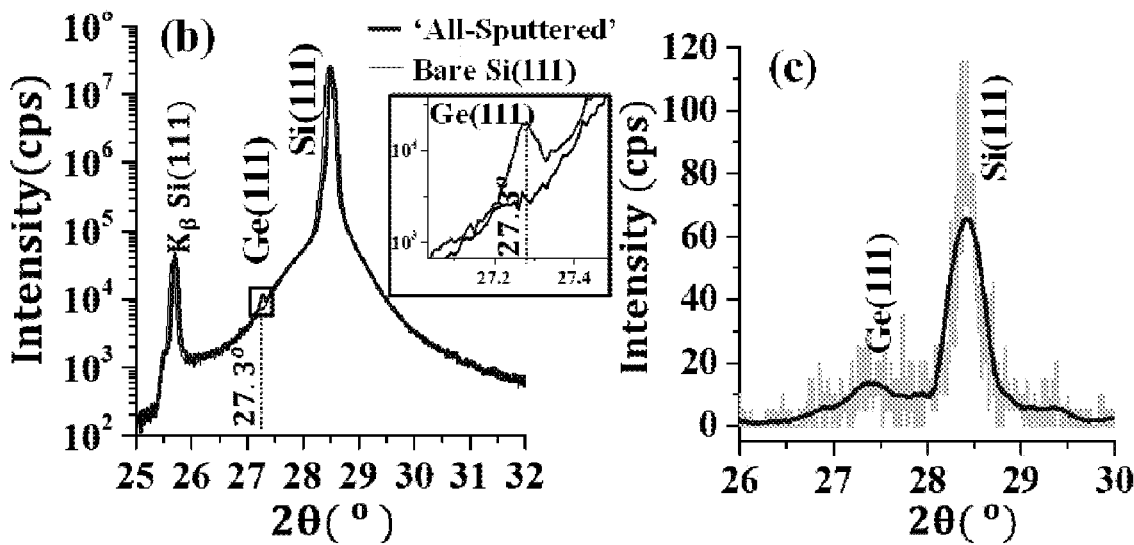
FIG. 8(b)
FIG. 8(c)

(a) Si/Gd$_2$O$_3$/Ge Interface  (b) Ge/Gd$_2$O$_3$/Cr Interface
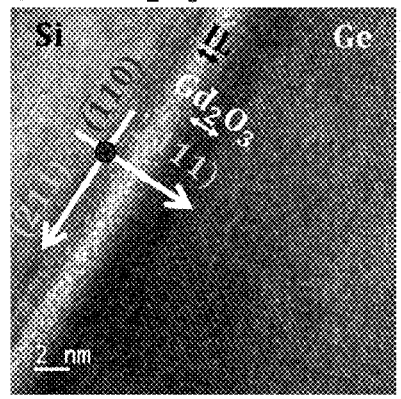 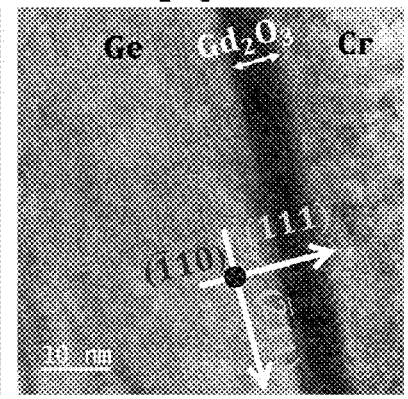
FIG. 10(a)  FIG. 10(b)
Epitaxial Relation Between (c) Gd$_2$O$_3$ – Si (b) Ge – Gd$_2$O$_3$
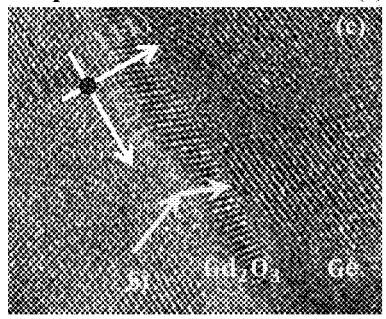 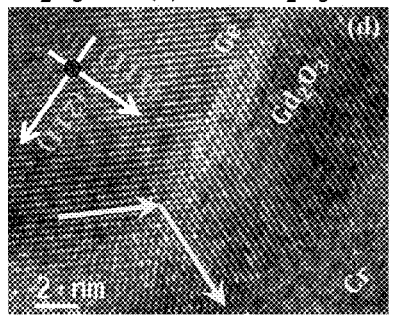
FIG. 10(c)  FIG. 10(d)

METHOD FOR FABRICATING GERMANIUM/SILICON ON INSULATOR IN RADIO FREQUENCY SPUTTER SYSTEM

FIELD OF INVENTION

The present disclosure relates to semiconductor substrate and more particularly to deposition of Gadolinium Oxide ($Gd_2O_3$) on the semiconductor substrate. The present application is based on, and claims priority from an Indian Application No. 201821023394 filed on 22 Jun. 2018 and PCT/IN2019/050469 filed on 21 Jun. 2019 the disclosure of which is hereby incorporated by reference herein.

BACKGROUND OF INVENTION

Silicon on insulator (SOI) enables Radio Frequency (RF) technology at advanced nodes. SOI-wafer cost is a key challenge due to complex manufacturing processes such as "smart cut" or wafer bonding.

Epitaxial growth of Rare Earth (RE) oxides followed by epi-Si growth is extensively explored for SOI stack preparation. Low lattice mismatch (~0.5%) between Silicon (Si) and RE oxides such as $Ce_2O_3$, $Pr_2O_3$, $Gd_2O_3$ etc., make it suitable for isolation oxide (IO) for SOI.

Among all, $Gd_2O_3$ is proven most promising, due to stable oxidation state (+3), large band gap (~5.9 eV) and, sufficient band offset ($\Delta E_c$=2.1 eV & $\Delta E_v$=2.8 eV). Epi-$Gd_2O_3$ has potential to be an attractive alternative for gate dielectric and IO layer in advanced CMOS technology $Gd_2O_3$ was deposited by pulsed laser deposition (PLD) on Si (100). Si (100) substrate at 600° C., by atomic layer deposition (ALD) system on Si (100) at 300° C. and by RF-sputter system on Si (100) substrate at 550° C.

In each case, a poor choice of orientation (Si<100>) and low deposition temperature led to a polycrystalline film. Only Molecular Beam Epitaxy (MBE) has demonstrated epi-$Gd_2O_3$ growth on Si (111) substrate at 700° C. However, high-volume manufacturing (HVM) by MBE is challenging.

OBJECT OF INVENTION

The principal object of the embodiments herein is to provide deposition of Gadolinium Oxide ($Gd_2O_3$) on a semiconductor substrate.

Another object of the embodiment herein is to provide deposition of elements of Group IV including Silicon (Si) or Germanium (Ge) on an epitaxial $Gd_2O_3$ using solid phase epitaxy (SPE) in a sputter chamber.

Another object of the embodiment is to provide a method for fabricating a Semiconductor on Insulator Substrate (SIS).

SUMMARY

Accordingly, the embodiments herein provide a method for deposition of Gadolinium Oxide ($Gd_2O_3$) on a semiconductor substrate. The method comprises of selecting, in an RF-sputter system, a predefined substrate and depositing, in an Ar-plasma struck, the $Gd_2O_3$, over the predefined substrate to obtain a layer of the $Gd_2O_3$ over the predefined substrate. The $Gd_2O_3$ is grown epitaxially over the predefined substrate. The method further provides performing, an anneal, of the layer of the $Gd_2O_3$ over the predefined substrate at a predefined temperature for a predefined time and obtaining, a resultant layer of the $Gd_2O_3$, over the predefined substrate.

Accordingly, the embodiments herein provide a method for fabricating Semiconductor on Insulator Substrate (SIS). The method comprises of growing an isolation layer of a Rare Earth (RE) oxide over a preselected substrate for obtaining a single crystalline seed layer at a predefined temperature. The growing is performed in a PVD system and the preselected substrate is a base layer. The method further comprises of depositing, an amorphous semiconductor layer over the seed layer at a predefined temperature and forming, a capping layer of the RE oxide over the deposited amorphous semiconductor layer over the seed layer, at a predefined capping temperature. The method further provides removing, the RE layer grown over the preselected substrate by using an etching process for obtaining the SIS.

BRIEF DESCRIPTION OF FIGURES

This method is illustrated in the accompanying drawings, throughout which like reference letters indicate corresponding parts in the various figures. The embodiments herein will be better understood from the following description with reference to the drawings, in which:

FIG. 8(a) illustrates the X-ray diffraction pattern for the Gd$_2$O$_3$—Ge—Gd$_2$O$_3$ hetero-structure deposited using solid phase epitaxy (SPE) in RF magnetron sputter chamber over Si(111) substrate for a symmetric ω-2θ scan on wide angle range for Gd$_2$O$_3$—Ge—Gd$_2$O$_3$ hetero-structure, showing Si peak, according to embodiments as disclosed herein;

FIG. 8(b) shows the X-ray diffraction pattern for the Gd$_2$O$_3$—Ge—Gd$_2$O$_3$ hetero-structure deposited using solid phase epitaxy (SPE) in RF magnetron sputter chamber over Si(111) substrate for a small angle range symmetric ω-2θ scan, where, the presence of Ge(111) peak at an angle 2θ=27.3° is highlighted in the inset, according to embodiments as disclosed herein;

FIG. 8(c) shows the X-ray diffraction pattern for the Gd$_2$O$_3$—Ge—Gd$_2$O$_3$ hetero-structure deposited using solid phase epitaxy (SPE) in RF magnetron sputter chamber over Si(111) substrate for a small angle range ω-2θ scan of the hetero-structure done with monochromator while aligning the sample with respect to the Ge(111) Bragg's angle (2θ=27.3°) by adjusting the χ to highlight the Ge(111) peak, according to embodiments as disclosed herein;

FIG. 10(a) illustrates a High-Resolution Transmission Electron Microscopy (HRTEM) image reflecting uniform layer of Ge crystals on Gd$_2$O$_3$ layer captured at Si—Gd$_2$O$_3$-Geinterface, according to embodiments as disclosed herein;

FIG. 10(b) illustrates TEM image captured at Ge—Gd$_2$O$_3$—Cr interface to show throughout uniformity of the Ge crystal stacking (Note: here Cr stands for Chromium), according to embodiments as disclosed herein;

FIG. 10(c) illustrates An HRTEM captured at Si—Gd$_2$O$_3$—Ge interface showing 180° rotated epitaxial relation between Si and the BOX Gd$_2$O$_3$ layer, according to embodiments as disclosed herein; and FIG. 10(d) illustrates an HRTEM image captured at Ge—Gd$_2$O$_3$—Cr interface to show epitaxial relation between Ge and the cap Gd$_2$O$_3$ layer, according to embodiments as disclosed herein.

DETAILED DESCRIPTION OF INVENTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

The proposed method provides Single crystal-Gd$_2$O$_3$ deposition in Radio Frequency (RF)-sputter. Proposed method explores, epi-Gd$_2$O$_3$ deposition process window. The deposition of the Gd$_2$O$_3$ is done on 2" RCA cleaned p-Si substrate or a Germanium (Ge) substrate with a desirable resistivity. The desirable resistivity comprises one of value greater than 1000 Ω·cm, low resistance value less than 10 Ω·cm or a pattern of differently doped regions the in the RF-sputter system. The proposed method is a low-cost, high-throughput and production compatible process.

Figure 1A:
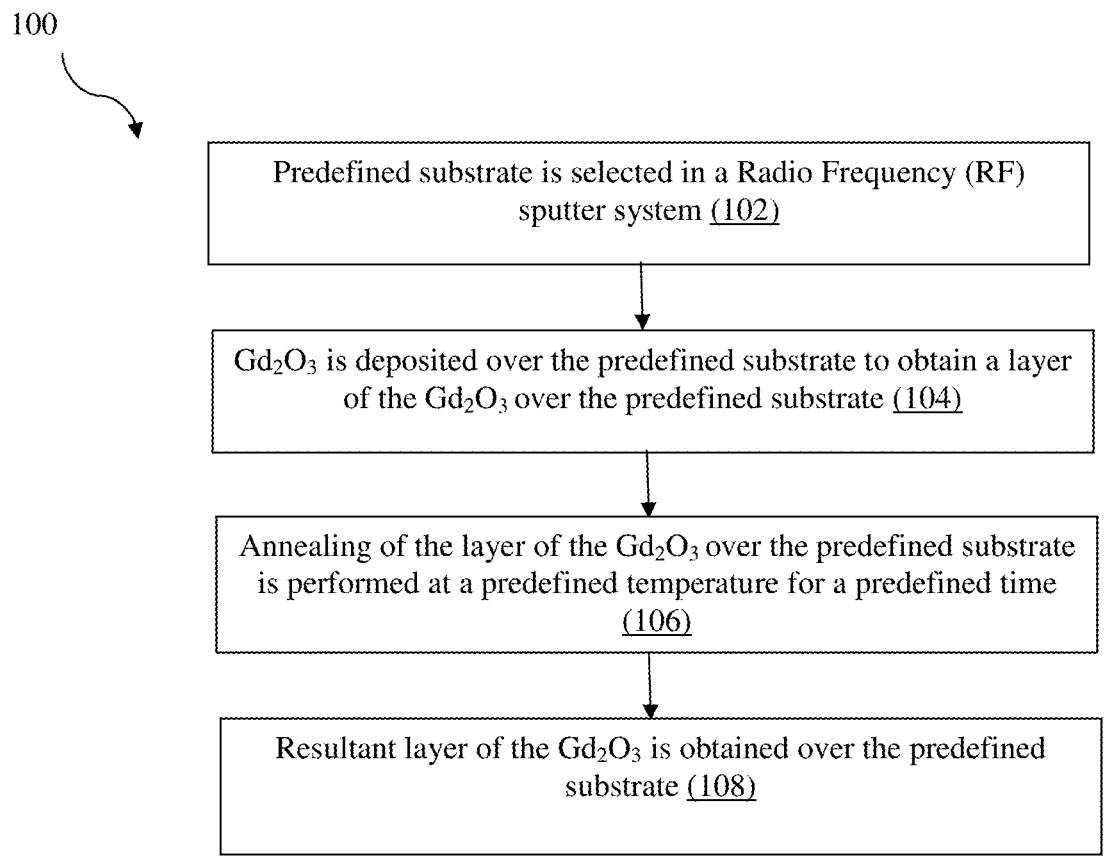
FIG. 1(a) shows flow chart for a method providing deposition of Gadolinium Oxide ($Gd_2O_3$) on a semiconductor substrate, according to embodiments as disclosed herein.

In accordance with an embodiment, referring to FIG. 1(a), a method 100 providing deposition of Gadolinium Oxide (Gd$_2$O$_3$) on a semiconductor substrate is shown. At step 102, the method 100 provides selection of a predefined substrate. The predefined substrate comprises one of a Silicon substrate or a Germanium (Ge) substrate. The predefined substrate is selected with a resistivity value greater than 1000Ω. The predefined substrate is selected in an RF-sputter system.

At step 104, the Gd$_2$O$_3$ is deposited over the predefined substrate in an Ar-plasma struck, to obtain a layer of the Gd$_2$O$_3$ over the predefined substrate. The Gd$_2$O$_3$ is deposited in an Ar-plasma struck. The Gd$_2$O$_3$ is grown epitaxially over the predefined substrate.

At step 106, annealing is performed of the layer of the Gd$_2$O$_3$ over the predefined substrate at a predefined temperature for a predefined time. The annealing is performed over one or more ambient conditions. The one or more ambient conditions comprise reducing H$_2$, oxidizing with O$_2$ or N$_2$O and using inert gases such as He, N$_2$ and Argon.

At step 108, the method 100 obtains a resultant layer of the Gd$_2$O$_3$, over the predefined substrate.

Figure 1B:
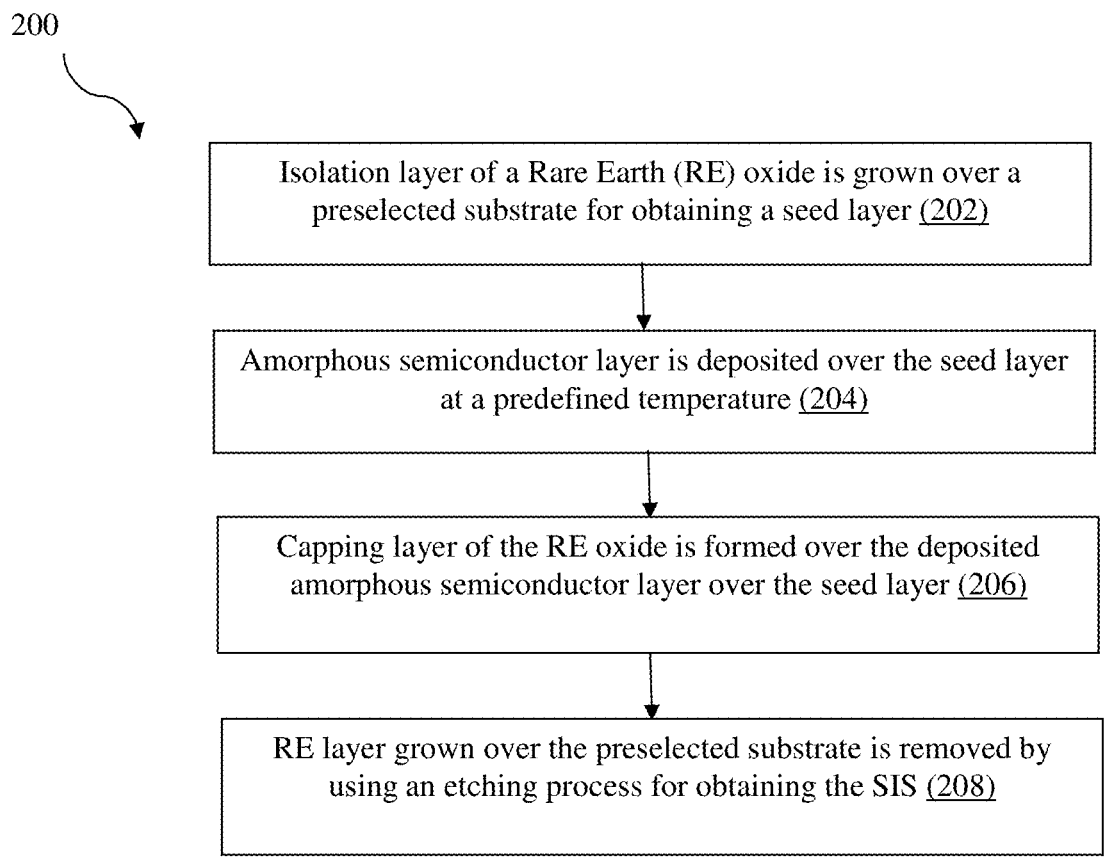
FIG. 1(b) shows a flow chart for a method fabricating Semiconductor on Insulator Substrate (SIS), according to embodiments as disclosed herein.

In another embodiment, referring to FIG. 1(b), a method 200 for fabricating Semiconductor on Insulator Substrate (SIS) is discussed. At step 202, the method provides growing, an isolation layer of a Rare Earth (RE) oxide over a preselected substrate for obtaining a single crystalline seed layer at a predefined temperature in a range of 500° C. to 800° C.). The growth of the RE oxide is performed in a Physical Vapor Deposition (PVD) system and the preselected substrate acts as a base layer.

The preselected substrate comprises one of a Silicon (Si), Germanium (Ge), Tin (Sn), or alloys of the preselected substrate. The rare earth oxide comprises one of a Gd$_2$O$_3$, Pr$_2$O$_3$, Yr$_2$O$_3$, Sm$_2$O$_3$, Dy$_2$O$_3$.

The PVD system comprises one of an RF-Magnetron Sputter system, evaporators or CVD system.

At step 204, an amorphous semiconductor layer is deposited over the seed layer at a predefined temperature in a range of 30° C. to 200° C. and at step 206, a capping layer of the RE oxide is formed over the deposited amorphous semiconductor layer over the seed layer. The capping layer is formed at a predefined capping temperature. The predefined capping temperature comprises in a range of 500° C. to 800° C.

At step 208, the method 200 provides a removal of the RE layer grown over the preselected substrate by using an etching process for obtaining the SIS. The etching process comprises at least one of a dry etching process and a wet etching process.

In accordance with an embodiment, details of the method 100 will now be explained.

The method 100 provides single crystal-Gd$_2$O$_3$ deposition on the Si or Ge in the RF-sputter. The method 100 provides deposition of Ge on the single crystal-Gd$_2$O$_3$ at Room Temperature (RT). Finally, the method 100 provides deposition of Gd$_2$O$_3$ on Ge at high temperature to cap and crystallize the Ge layer.

Proposed method 100 explores, epi-Gd$_2$O$_3$ deposition process window. The deposition is done on 2" RCA cleaned p-Si substrate with resistivity >1000 Ω·cm in RF-sputter system-A low-cost, high-throughput and production compatible process. The process chambers base pressure is $2\times10^{-7}$ Torr.

The deposition of the $Gd_2O_3$ is done in the Ar-plasma struck at a power in range of low power from 60 W to 65 W) such that the deposition rate is less than 1 nm/min (0.1-0.5 nm/min). During the deposition, pressure of process chamber pressure of the Ar-plasma struck is maintained at a predefined pressure value. The predefined pressure comprises in a range of $1\times10^{-7}$ torr to $1\times10^{-6}$ torr.

The deposition may be performed at one or more temperature values. The one or more temperature values comprises in a range of 600° C. to 800° C. In an exemplary embodiment, the method 100 of deposition may be executed through an experiment carried out at three different temperatures selected from the one or more temperature values. The three different temperature selected are 650° C., 700° C. and 750° C.

The method 100 is executed by using two different orientations of the silicon substrate. The two different orientations comprise each of Si<111> and Si<100> (as shown in Table 1 below).

TABLE 1

Experimental splits used in the method 100

| Substrate orientation | Si (111) | | | Si (100) |
|---|---|---|---|---|
| Deposition temperature (° C.) | 650° C. | 700° C. | 750° C. | 700° C. |
| Observations | No $Gd_2O_3$ peak | Monoclinic $Gd_2O_3$ | Monoclinic $Gd_2O_3$ | Monoclinic $Gd_2O_3$ + cubic $Gd_2O_3$ |

Figure 2A:
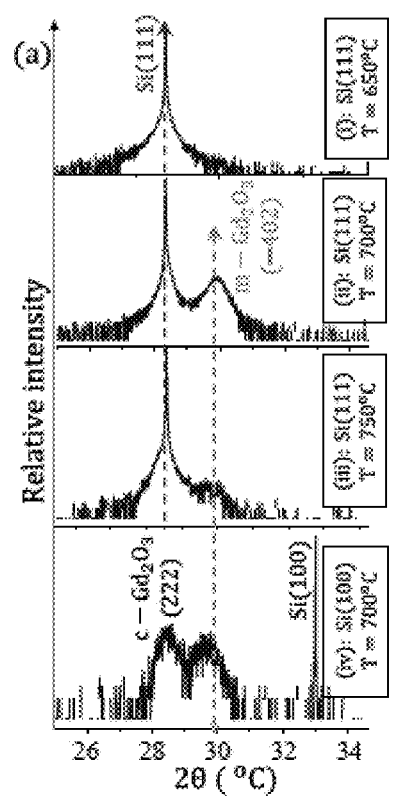
FIG. 2(a) shows Small angle range ω-2θ scan for $Gd_2O_3$ deposited on Si (111) at (i). 650° C., (ii). 700° C., (iii). 750° C. and (iv), on Si (100) at 700° C., according to embodiments as disclosed herein.

In accordance with an embodiment, in FIG. 2(a) (i), it may be observed that $Gd_2O_3$ peak is absent for T=650° C. deposition on Si (111). For temperature T≥700° C., a clear peak is present, representing (−402) orientation of monoclinic $Gd_2O_3$ (as shown in FIG. 2(a) (ii) and FIG. 2(a) (iii)).

Now compared to Si (111), Si (100) substrate results in a bi-phase (including each of cubic $Gd_2O_3$ layer and monoclinic $Gd_2O_3$ layer) formation as shown in FIG. 2(a) (iv).

Due to different thermal coefficient of Si ($2.6\times10^{-6}$ K$^{-1}$) and $Gd_2O_3$ ($8.0\times10^{-1}$ K$^{-1}$), lattice matching is tunable with temperature. It may be further reported that, at T~700° C., lattice mismatch between the silicon substrate and $Gd_2O_3$ becomes zero.

Proposed method 100 also reports that, $Gd_2O_3$ deposition over the silicon substrate Si (111) follow layer-by-layer growth mechanism, due to favorable surface energy. Hence, $Gd_2O_3$ deposition at 700° C. on Si (111) is may be preferred for epitaxial growth of the $Gd_2O_3$ over the silicon substrate.

Figure 2B:
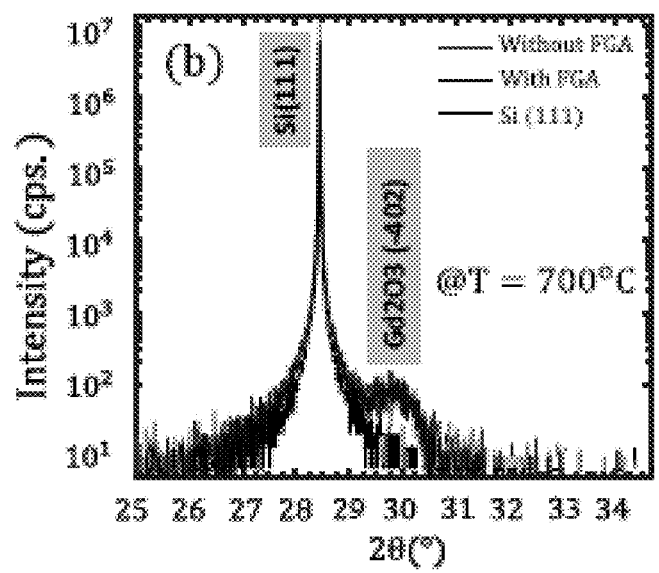
FIG. 2(b) shows each of before and after Forming Gas Annealing (FGA) ω-2θ comparison, according to embodiments as disclosed herein.

The method 100 also provides, Annealing (Forming Gas Annealing (FGA)) performed at a predefined temperature comprising in range of 550° C. to 650° C. The FGA is performed for a predefined time comprising in a range of 10 minutes to 30 minutes for improving $Gd_2O_3$/Si interface. It may be noted that an effect of the FGA on deposited $Gd_2O_3$ over the silicon substrate (in form of crystal) is negligible as peak intensity corresponding to m-$Gd_2O_3$ (−402) in ω-2θ scan remain intact (also shown FIG. 2(b)).

The method 100 provides the layer of the $Gd_2O_3$ (in the crystal form) deposited over the predefined substrate obtained in a predefined thickness. The predefined thickness comprises in a range of 30 nm to 33 nm.

Figure 2C:
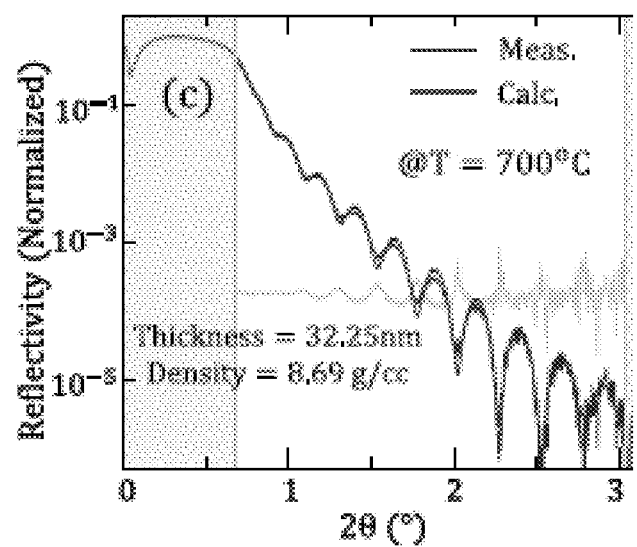
FIG. 2(c) shows a perfect fit of X-ray Reflectometry (XRR) against calculated data showing accuracy of thickness, according to embodiments as disclosed herein.

In an embodiment, referring to FIG. 2(c), the thickness of the $Gd_2O_3$ layer from XRR global fit is 32.25 nm and gives 0.63 nm/min deposition rate. Density of the $Gd_2O_3$ layer is 8.69 g/cc.

Figure 3:
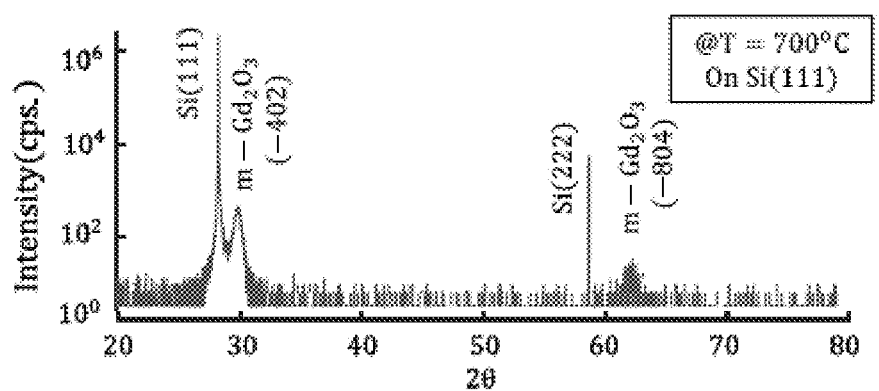
FIG. 3 shows Wide angle range ω-2θ scan of epi-$Gd_2O_3$/Si (111) stack deposited, according to embodiments as disclosed herein.

As shown in FIG. 3, a wide-angle range ω-2θ for the $Gd_2O_3$/Si (111) stack shows peaks corresponding to Si (111) at 28.44° and monoclinic $Gd_2O_3$ (−402) at 30.01°. Appearance of $Gd_2O_3$ (−804) peak at 62.5° is expected from the 'epi-$Gd_2O_3$ deposition'.

Figures 4A, 4B:
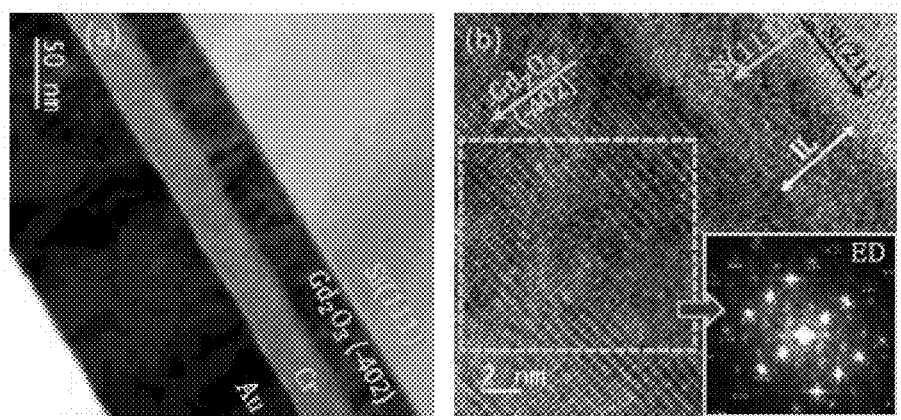
FIG. 4(a) illustrates Transmission Electron Microscopic (TEM) image of stack on 50 nm scale to show uniformity of epi-$Gd_2O_3$ layer, according to embodiments as disclosed herein.
FIG. 4(b) shows High-resolution TEM image of $Gd_2O_3$/Si stack at 2 nm scale, showing ordered stacking of the dielectric, according to embodiments as disclosed herein.
Figure 5A:
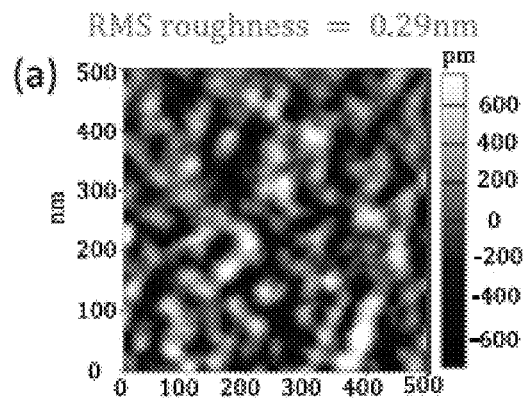
FIG. 5(a) illustrates Atomic Force Microscopic (AFM) image describing the surface roughness of the epi-$Gd_2O_3$ layer, according to embodiments as disclosed herein.

Referring to FIG. 4(a), Transmission Electron Microscopy (TEM) image on a 50 nm scale shows a uniform deposition of the $Gd_2O_3$ layer. A high-resolution TEM image of $Gd_2O_3$ (−402)/Si(111) stack on a 2 nm scale shows perfectly ordered $Gd_2O_3$ crystal planes. FIG. 4(b) shows respective Electron Diffraction (ED) for $Gd_2O_3$ crystal planes (FIG. 4(b)-inset). Ordered arrangement of (−402) planes in TEM image confirms epitaxial $Gd_2O_3$ deposition. The rms roughness of 0.29 nm is extracted for the epi-$Gd_2O_3$ layer from Atomic Force Microscope (AFM) (shown in FIG. 5(a)).

Figure 5B:
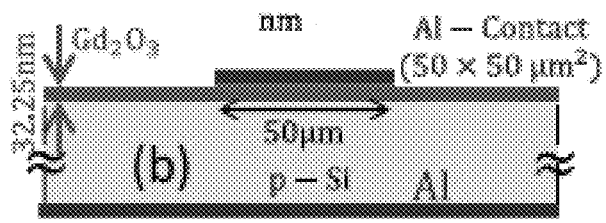
FIG. 5(b) shows schematic of the Metal Oxide Semiconductor Capacitance (MOSCAP) structure fabricated, according to embodiments as disclosed herein.
Figure 5C:
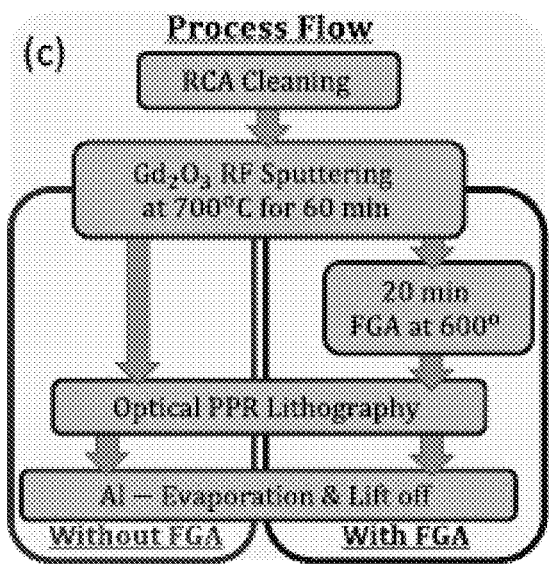
FIG. 5(c) shows fabrication process flow used to deposit epi-$Gd_2O_3$ on Si (111), according to embodiments as disclosed herein

Now referring to FIG. 5(b), electrical characterization of the layer is shown. As shown in FIG. 5(b), MOSCAP structure (Al/$Gd_2O_3$/Si/Al) is fabricated and characterized. Top contact of the MOSCAP is patterned (50×50 μm$^2$) using UV-lithography and back contact is a blanket Al-evaporation (shown in FIG. 5(c)).

Figure 6A:
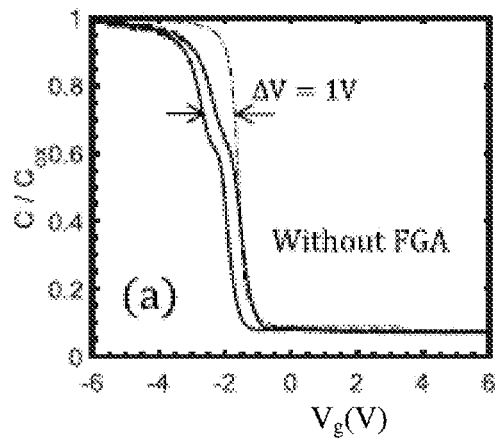
FIG. 6(a) illustrates CV without FGA, according to embodiments as disclosed herein.
Figure 6B:
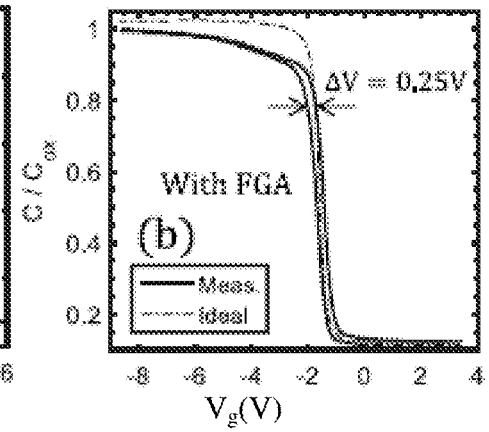
FIG. 6(b) shows CV with FGA, according to embodiments as disclosed herein.

In FIG. 6(a), Capacitance-Voltage (CV) measurements after series resistance correction show a kink due to the presence of sharp trap energy distribution at the $Gd_2O_3$/Si interface and the location shifts after FGA (shown in FIG. 6(b)).

Figure 6C:
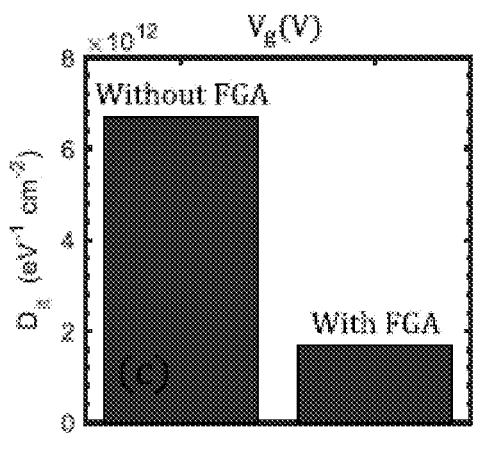
FIG. 6(c) illustrates extracted $D_{it}$ for each of the CV without FGA and CV with FGA case, according to embodiments as disclosed herein.
Figure 6D:
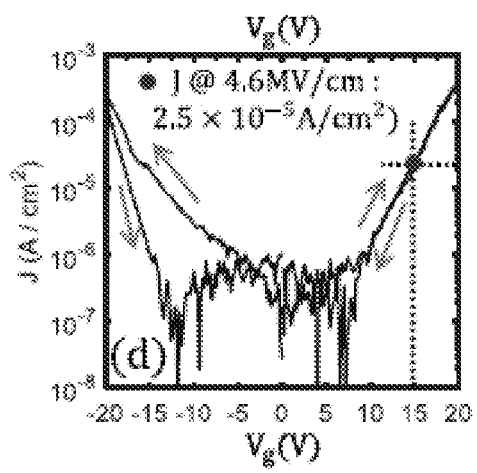
FIG. 6(d) shows absolute current density profile for without-FGA MOSCAP, according to embodiments as disclosed herein.

Referring to FIG. 6(c), Interface trap density ($D_{it}$) is extracted in each cases at 10 KHz frequency. The $D_{it}$ extracted before and after FGA is $8.4\times10^{12}$ eV$^{-1}$ cm$^{-2}$ and $3.4\times10^{12}$ eV$^{-1}$ cm$^{-2}$ respectively. Dielectric constant (κ) extracted for before and after FGA structure is 13 and 11 respectively. Low leakage current density ~$2.48\times10^{-5}$ A/cm$^2$ is calculated at 4.6 MV/cm electric field (for without FGA) (shown in FIG. 6(d)). Further, hysteresis in current profile indicates trapped charge movement.

High temperature (700° C.) vis a vis process conditions to enable low deposition rate (0.63 nm/min) facilitates $Gd_2O_3$ epitaxy on Si with appropriate substrate orientation in RF sputter. Formation of monoclinic epi-$Gd_2O_3$ with (−402) orientation on Si (111) is confirmed by X-Ray Power Diffraction (XRD) and TEM imaging. Finally, comparable electrical qualities with state-of-art $Gd_2O_3$ (MBE, ALD and Sputter) results is demonstrated (Table 2). Demonstration of epi-$Gd_2O_3$ on Si in a HVM RF-sputter is a precursor to low-cost SOI-wafer.

Table-2 below shows performance comparison for $Gd_2O_3$ MOSCAP fabricated:

TABLE 2

| Reference | Prior art | Prior art | Prior art | Proposed method 100 |
|---|---|---|---|---|
| Stack | $Gd_2O_3$/Si(001) | | $Gd_2O_3$/Si(111) | $Gd_2O_3$/Si(111) |
| Tool used | ALD | RF sputter | MBE | RF sputter |
| $Gd_2O_3$ quality | Poly (cubic) | Poly (Cubic + Monoclinic) | SC (cubic) | SC (Monoclinin) |
| Thickness (nm) | 10 | 12 | 5 | 32.25 |
| Dielectric constant | 15 | 9.3-17.2 | — | 11-13 |

TABLE 2-continued

| Reference | Prior art | Prior art | Prior art | Proposed method 100 |
|---|---|---|---|---|
| Trap density ($eV^{-1}cm^{-2}$) | $3.2 \times 10^{12}$ | — | $2.4 \times 10^{12}$ | $3.4 \times 10^{12}$ |
| Current density ($A/cm^2$) @ 4.6 MV/cm | ~$3.1 \times 10^{-6}$ | ~$7 \times 10^{-1}$ | ~$9 \times 10^{-5}$ | $2.5 \times 10^{-5}$ |

In accordance with an embodiment, details of the method 200 will now be explained. The method 200 provides a low cost SOI, GeOI and SiGeOI substrate using solid phase epitaxy technique in a thin film deposition system, like RF magnetron sputter system. The RE oxides are used as isolation layer, due to low lattice mismatch and lattice parameters are tunable with temperature. The lattice parameters will be negligible at 700° C.

Figure 7:
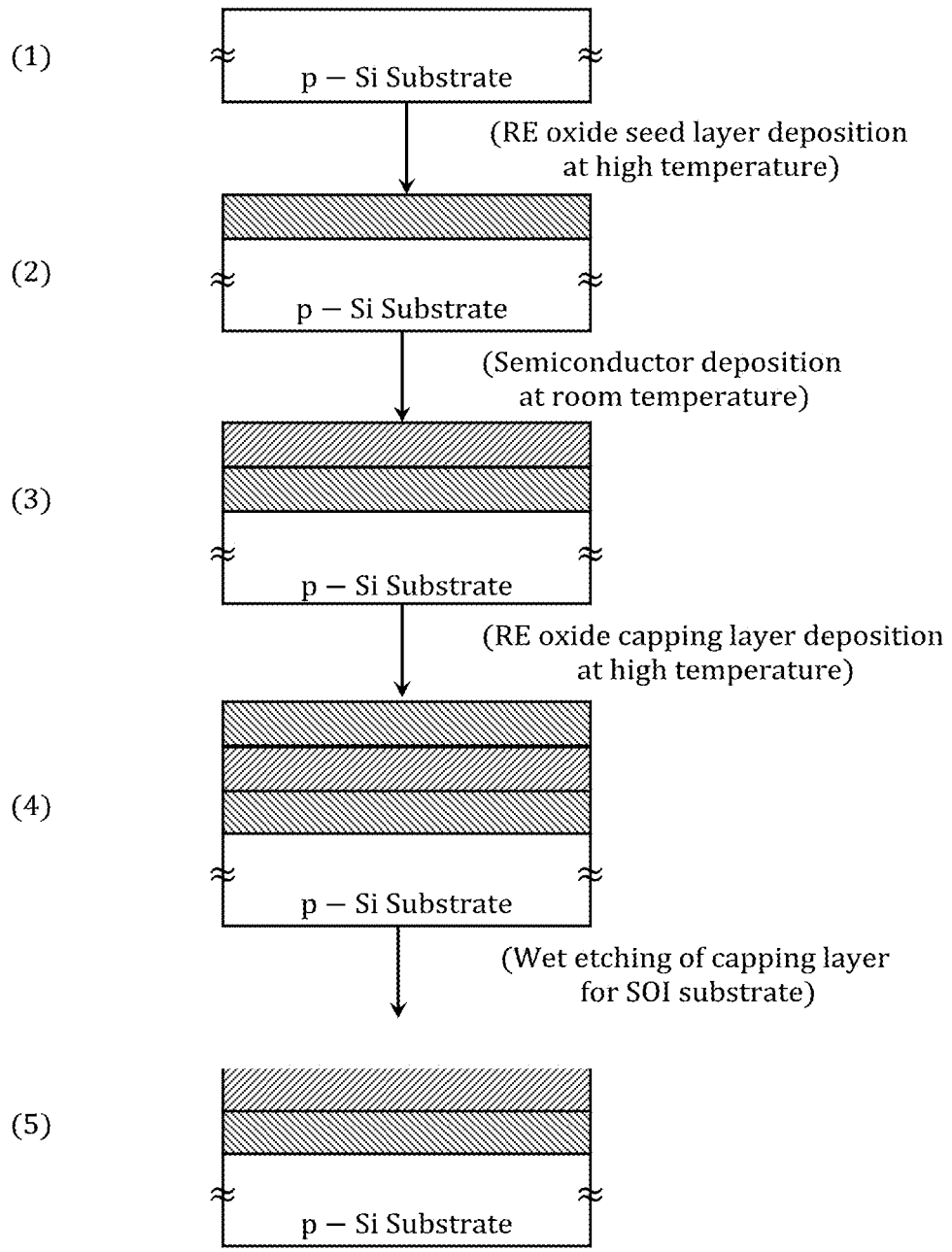
FIG. 7 illustrates schematics of process flow involved in growing the Gd$_2$O$_3$—Ge—Gd$_2$O$_3$ hetero-structure on Si(111) substrate, according to embodiments as disclosed herein.

FIG. 7 illustrates the schematics of the method 200 showing process flow involved in growing the $Gd_2O_3$—Ge—$Gd_2O_3$ hetero-structure on Si(111) substrate.

The proposed method 200 also provides the deposition of Ge on the $Gd_2O_3$ at room temperature in the same RF sputter system (as discussed above). Further the method 100 provides deposition of $Gd_2O_3$ cap layer on the Ge at high temperature in order to crystalize the Ge layer and prevents an island formation in the Ge layer (shown in step 1 and step 2 of FIG. 7).

Once the $Gd_2O_3$—Ge—$Gd_2O_3$ hetero-structure is deposited on Si substrate, the $Gd_2O_3$ cap layer is removed using dilute sulfuric acid for obtaining the resultant of the $Gd_2O_3$ over the predefined substrate (shown in step 3, 4 and 5 of FIG. 7).

As discussed above, at first cubic rare earth (RE) oxide is grown as a seed layer on the Si substrate at high temperature in a range of (500° C.-800° C.) and predefined RF power. The predefined RF power comprises in a range of 15 W to 25 W essentially to keep the deposition rate less than 1 nm/min in a PVD (RF-Magnetron sputter) system.

After the RE oxide is grown as the seed layer, the amorphous semiconductor layer is then deposited over the seed layer at room temperature in the deposition chamber (step 2 of FIG. 7). The method 700 is the followed by depositing the capping layer of RE oxide over amorphous semiconductor layer at high temperature in the deposition chamber.

Lastly, for obtaining the SOI, RE oxide (as deposited on top) is removed by using the etching process. The removal may be done by using at least one of the wet etching and the dry etching (step 4 and step 5 of FIG. 7). In an example, at first a dry etching may be carried out and near an interface of the SOI, the wet etching may be used to prevent surface roughness increase.

The removal of RE oxide capping layer, will result in semiconductor on insulator stack which is essential to reduce substrate leakage and improve short channel effect in RF and CMOS logic applications.

Furthermore, the method 200 also provides a growth of an epi-semiconductor layer over the SOI after the etching is performed. The growth of the epi-semiconductor layer over the SOI improves semiconductor quality of the SOI. The growth of the epi-semiconductor may be carried out in same deposition chamber (PVD or CVD) at high temperature.

FIG. 8(a) illustrates the X-ray diffraction pattern for the $Gd_2O_3$—Ge—$Gd_2O_3$ hetero-structure deposited using solid phase epitaxy (SPE) in RF magnetron sputter chamber over Si(111) substrate for a symmetric ω-2θ scan on wide angle range for $Gd_2O_3$—Ge—$Gd_2O_3$ hetero-structure, which primarily shows Si peak.

FIG. 8(b) illustrates the X-ray diffraction pattern for the $Gd_2O_3$—Ge—$Gd_2O_3$ hetero-structure deposited using solid phase epitaxy (SPE) in RF magnetron sputter chamber over Si(111) substrate for a small angle range symmetric ω-2θ scan, where, the presence of Ge(111) peak at an angle 2θ=27.3° is highlighted in the inset.

FIG. 8(c) illustrates the X-ray diffraction pattern for the $Gd_2O_3$—Ge—$Gd_2O_3$ hetero-structure deposited using solid phase epitaxy (SPE) in RF magnetron sputter chamber over Si(111) substrate for small angle range ω-2θ scan of the hetero-structure done with monochromator while aligning the sample w.r.t the Ge(111) Bragg's angle (2θ=27.3°) by adjusting the χ to highlight the Ge(111) peak, showing a significantly weak but clear intensity peak-consistent with the high intensity peak without the monochromator in (b).

Appearance of Ge(111) peak at 27.3° and absence of any other stray peak is a primary evidence of the Ge layer being single crystalline.

Figure 9A:
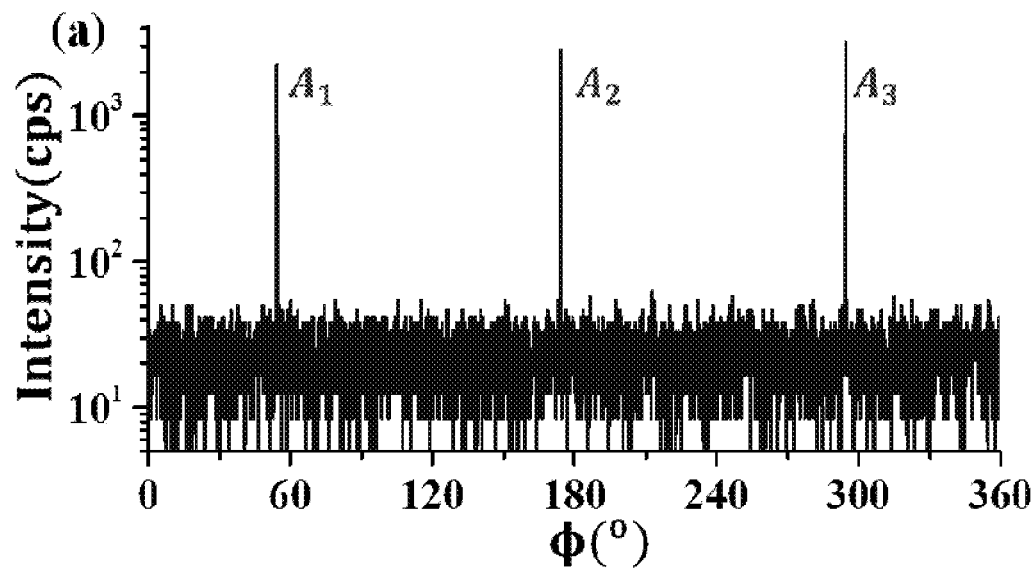
FIG. 9(a) illustrates a @ scan done for Ge(111) plane by fixing 2θ=27.3$^i$ and the χ=70.5°, according to embodiments as disclosed herein.
Figure 9B:
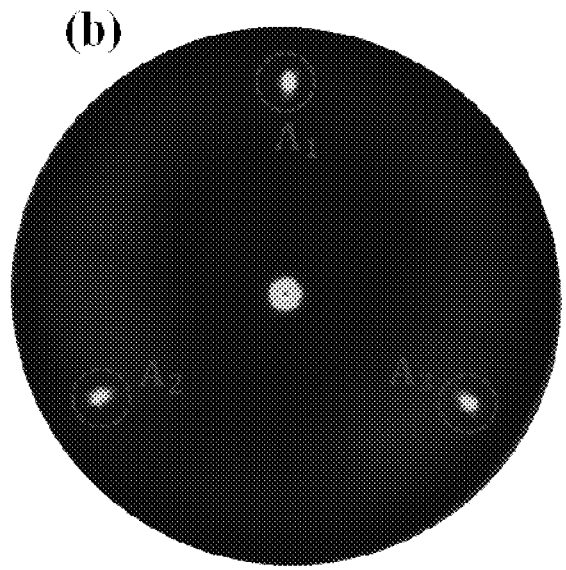
FIG. 9(b) shows a pole figure measurement done to probe Ge(111) crystal plane family by fixing 2θ=27.3°, according to embodiments as disclosed herein.
Figure 9C:
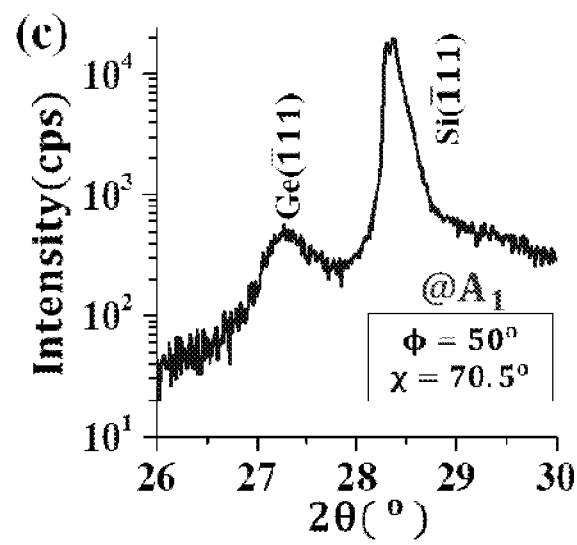
FIG. 9(c) shows an ω-2θ scan done by fixing φ=50° and χ=70.5°, according to embodiments as disclosed herein.

FIG. 9(a) illustrates φ scan is done for Ge(111) plane by fixing the 2θ=27.3$^i$ and the χ=70.5° and FIG. 9(b) shows a pole figure measurement done to probe Ge(111) crystal plane family by fixing 2θ=27.3°. FIG. 9(c) shows an ω-2θ scan done by fixing φ=50° and χ=70.5°. A presence of Ge(111) crystal plane establishes the formation of single crystalline Ge layer with (111) orientation.

FIG. 10(a) illustrates a HRTEM image reflecting uniform layer of Ge crystals on $Gd_2O_3$ layer captured at Si—$Gd_2O_3$-Geinterface and FIG. 10(b) shows TEM image captured at Ge—$Gd_2O_3$—Cr interface to show throughout uniformity of the Ge crystal stacking (Note: here Cr stands for Chromium).

FIG. 10(c) shows the HRTEM captured at Si—$Gd_2O_3$—Ge interface showing 180° rotated epitaxial relation between Si and the BOX $Gd_2O_3$ layer and FIG. 10(d) shows the HRTEM image captured at Ge—$Gd_2O_3$—Cr interface to show epitaxial relation between Ge and the cap $Gd_2O_3$ layer.

In the proposed method 200, the single crystalline cubic RE oxide may be deposited on the Si substrate. Phase transformation from cubic crystal (SOI) to monoclinic crystal (SOI) without disturbing stacking order may be selected based on one or more deposition conditions. The one or more deposition conditions comprises deposition at 60±20 W RF power and at 750±100° C. substrate temperature.

Epi-semiconductor layer may be formed on the insulator, for example, the proposed method 200 is capable of fabricating substrates for PDSOI with thickness in a range of 50 nm to 80 nm and FDSOI with thickness in a range of 3 nm to 7 nm.

Use of $Al_2O_3$ as isolation and capping oxide or use of sapphire substrate will enable the III-V semiconductors as channel materials for semiconductor-on-insulator substrate fabrication.

Proposed SOI fabricated through the method 200 may be used for variety of applications. The variety of applications can be 3D integrations, 3D memory, optical devices (Bragg reflectors, waveguides etc.) etc.

The proposed SOI fabricated through the method 200 provides a hetero-structure with excellent structural quality and may be used for novel Nano-electronics applications such as Nano scale devices with high channel mobility, resonant tunneling devices etc. By altering deposition conditions, a desired strain may also be introduced in the SOI channel layer.

In addition to the sputter process provided through the method 700, a sample preparatory chamber may also be used to enable high temperature bake-out or pre-plasma treatment (e.g. H2 plasma or HF) for surface clean.

Interface quality of the SOI may also be fixed by interface engineering, e.g. $(Gd_2O_3):(Al_2O_3)::(x:y)$, may be graded in x-y and z direction to adjust lattice constant in an analog manner. The predefined substrate is silicon substrate with <111> orientation however, other orientations <100> and <110> are also possible.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

We claim:

1. A method for fabricating Semiconductor on Insulator Substrate (SIS), the method comprising:

depositing an isolation layer of Gadolinium oxide ($Gd_2O_3$) over a preselected substrate for obtaining a single crystalline $Gd_2O_3$ seed layer at a predefined temperature, wherein the deposition is performed in a Radio Frequency (RF)-sputter system, wherein the predefined temperature for depositing the isolation layer of $Gd_2O_3$ is in a range of 500° C.-800° C.;

depositing a Group IV semiconductor layer including Silicon (Si) or Germanium (Ge) over the single crystalline $Gd_2O_3$ seed layer at a room temperature;

forming a $Gd_2O_3$ capping layer over the deposited Group IV semiconductor layer over the single crystalline $Gd_2O_3$ seed layer at the predefined temperature in the range of 500° C.-800° C.; and removing the $Gd_2O_3$ capping layer deposited over the Group IV semiconductor layer by using an etching process for obtaining the SIS.

2. The method as claimed in claim 1, wherein the preselected substrate comprises one of a Silicon (Si), Germanium (Ge), Germanium-Tin (GeSn), or alloys of the preselected substrate.

3. The method as claimed in claim 1, wherein the etching process comprises performing a dry etching process at an interface of the SIS and performing a wet etching process to prevent an increase in surface roughness.

4. The method as claimed in claim 1, wherein the predefined capping temperature comprises in a range of 500° C. to 800° C.

5. The method as claimed in claim 1, wherein depositing the isolation layer of $Gd_2O_3$ over the preselected substrate for obtaining the single crystalline $Gd_2O_3$ seed layer comprises:

depositing, in an Ar-plasma struck, the isolation layer of $Gd_2O_3$ over the preselected substrate to obtain the single crystalline $Gd_2O_3$ seed layer, wherein depositing is performed in the predefined temperature to enable in-situ annealing for obtaining the single crystalline $Gd_2O_3$ seed layer to be used as insulator layer or buried oxide layer for the SIS.

6. The method as claimed in claim 5, wherein deposition of the isolation layer of $Gd_2O_3$ over the preselected substrate is performed at a predefined pressure in a range of $1\times10^{-7}$ torr to $1\times10^{-6}$ torr, wherein the predefined pressure is performed in a process chamber in the RF-sputter system.

* * * * *